(12) United States Patent
Yamazaki et al.

(10) Patent No.: US 10,685,765 B2
(45) Date of Patent: Jun. 16, 2020

(54) CABLE WITH OPERATION UNIT

(71) Applicant: SUMITOMO ELECTRIC INDUSTRIES, LTD., Osaka-shi, Osaka (JP)

(72) Inventors: Nobuyuki Yamazaki, Kanuma (JP); Toru Nakanishi, Kanuma (JP); Takayoshi Koinuma, Guangdong (CN)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 16/340,725

(22) PCT Filed: Oct. 31, 2016

(86) PCT No.: PCT/CN2016/104020
§ 371 (c)(1),
(2) Date: Apr. 10, 2019

(87) PCT Pub. No.: WO2018/076340
PCT Pub. Date: May 3, 2018

(65) Prior Publication Data
US 2019/0318844 A1    Oct. 17, 2019

(51) Int. Cl.
| H01B 11/04 | (2006.01) |
| H01B 7/08 | (2006.01) |
| H01B 7/24 | (2006.01) |
| H01B 7/02 | (2006.01) |
| H05K 9/00 | (2006.01) |

(52) U.S. Cl.
CPC ............. *H01B 7/24* (2013.01); *H01B 7/0241* (2013.01); *H05K 9/0098* (2013.01)

(58) Field of Classification Search
CPC .................................. H01B 11/04; H01B 7/08
USPC .................................. 174/113 R, 117 F, 115
See application file for complete search history.

(56) References Cited

U.S. PATENT DOCUMENTS

| 3,571,486 A * | 3/1971 | Kennedy ............. H01B 7/0072 174/11 R |
| 3,715,458 A * | 2/1973 | Bayes ...................... H01B 7/40 174/113 R |

(Continued)

FOREIGN PATENT DOCUMENTS

| CN | U-202940431 | 5/2013 |
| JP | 2012-529844 A | 11/2012 |
| WO | WO-2010/144188 A2 | 12/2010 |

*Primary Examiner* — Chau N Nguyen
(74) *Attorney, Agent, or Firm* — Faegre Drinker Biddle & Reath LLP

(57) ABSTRACT

A cable with an operation unit having an operation unit provided on a middle of a cable which includes a plurality of core electric wires. The plurality of core electric wires are bundled to form a bundle of electric wires, the bundle of electric wires is divided into two groups, each of which is covered with a coating resin, and the cable includes a separated part at each of front and rear parts of the operation unit by a predetermined length, in which bundles of electric wires of the two groups are separately configured, and an integrated part in which the bundles of electric wires of the two groups are integrated at a part except the separated part. A boundary part between the separated part and the integrated part is covered with a reinforcing member.

5 Claims, 4 Drawing Sheets

(56) References Cited

U.S. PATENT DOCUMENTS

| | | | |
|---|---|---|---|
| 8,494,656 B2 * | 7/2013 | Seifert | A61N 1/05 607/122 |
| 2009/0101388 A1 * | 4/2009 | Chen | H01R 23/661 174/117 FF |
| 2009/0188716 A1 * | 7/2009 | Nagase | A61B 1/00016 174/72 A |
| 2017/0330652 A1 * | 11/2017 | Tanabe | H01B 13/0006 |

* cited by examiner

CABLE WITH OPERATION UNIT

TECHNICAL FIELD

The present invention relates to a cable with an operation unit.

BACKGROUND ART

There has been known a cable with an operation unit provided on a middle of a cable. For example, FIGS. 15 to 17 of Patent Document 1 discloses a headphone cable having a controller provided on a middle of the cable.

PRIOR ART DOCUMENT

Patent Document

Patent Document 1: JP-A-2012-529844

SUMMARY OF THE INVENTION

Problems to be Solved

For example, the cable with an operation unit (headphone cable) disclosed in Patent Document 1 includes a cable configured by a bundle of electric wires (a bundle of conductive wires) formed by bundling a plurality of core electric wires. One end of the cable is configured by two cables, and the cables are respectively connected to left and right (stereo) earphones. The two bundles of electric wires are integrally covered with a sheath at a Y joining part, so that the two cables are formed into one cable, and the other end of the cable is connected to a plug. An operation unit (controller) is provided on a middle of the cable between the Y joining part and the plug. In the cable with the operation unit, when the operation unit is tilted or rotated upon operation of the operation unit, the cable is also bent or twisted so as to move in association with the tilting or rotation. Therefore, bending and twisting forces are applied to the core electric wires configuring the bundle of electric wires, so that the core electric wires are likely to break in the vicinity of the operation unit.

An object of the present invention is to provide a cable with an operation unit in which core electric wires are difficult to break.

Means for Solving Problems

A cable with an operation unit according to an aspect of the present invention is a cable with an operation unit provided on a middle of a cable which includes a plurality of core electric wires, wherein the plurality of core electric wires are bundled to form a bundle of electric wires, wherein the bundle of electric wires is divided into two groups, each of which is covered with a coating resin, and wherein the cable includes:

a separated part provided at each of front are rear parts of the operation unit by a predetermined length, in which bundles of electric wires of the two groups are separately configured; and an integrated part in which the bundles of electric wires of the two groups are integrated at a part except the separated part.

Effects of the Invention

According to the present invention, it is possible to provide a cable with an operation unit in which core electric wires are difficult to break.

DETAILED DESCRIPTION OF EMBODIMENTS

Description of Embodiment of Present Invention

Figure 1:
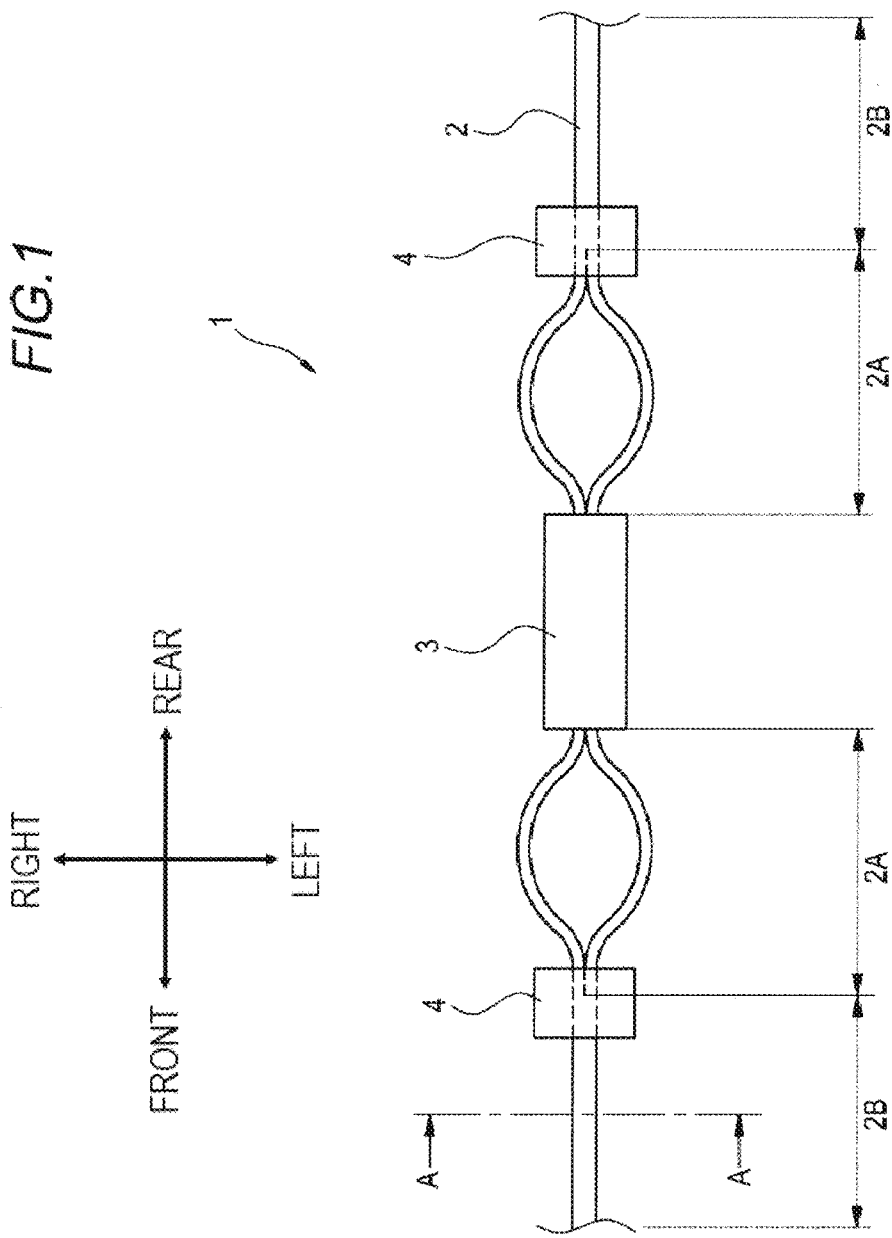
FIG. 1 is a schematic view of a cable with an operation unit according to an embodiment of the present invention.

First, aspects of the present invention are listed.

A cable with an operation unit according to an aspect of the present invention is (1) a cable with an operation unit provided on a middle of a cable which includes a plurality of core electric wires, wherein the plurality of core electric wires are bundled to form a bundle of electric wires, wherein the bundle of electric wires is divided into two groups, each of which is covered with a coating resin, and wherein the cable includes:

a separated part provided at each of front and rear parts of the operation unit by a predetermined length, in which bundles of electric wires of the two groups are separately configured; and an integrated part in which the bundles of electric wires of the two groups are integrated at a part except the separated part.

According to the above configuration, since the cable with the operation unit includes the separated part provided at each of front and rear parts of the operation unit by the predetermined length, in which the bundles of electric wires of the two groups are separately configured, when the operation unit is operated, the bundles of electric wires separately configured can move, respectively. Therefore, it is possible to release a force which is to be applied to the cable when the operation unit moves. Since a bending or twisting force is difficult to be applied to the plurality of core electric wires configuring the bundles of electric wires, the core electric wires are difficult to break.

(2) A boundary part between the separated part and the integrated part may be covered with a reinforcing resin.

Since the boundary part between the separated part and the integrated part is reinforced with the reinforcing resin, it is possible to prevent the integrated part from being split from the boundary part.

(3) In the integrated part, the bundles of electric wires of the two groups may be integrally covered with the coating resin.

Since the bundles of electric wires of the two groups are integrally covered with the coating resin, it is possible to make it difficult for the integrated part from being split.

(4) In the integrated part, the bundles of electric wires of the two groups may be respectively covered with the coating resins, and the coating resins may be fused each other at a portion where he coating resins are contacted to each other.

Since the coating resins of the bundles of electric wires of the two groups are fused each other, it is possible to easily form the integrated part.

(5) In the integrated part, the plurality of core electric wires may be stranded in each of the bundles of electric wires of the two groups, and respective stranding directions may be opposite to each other.

Since the plurality of core electric wires are stranded in each of the bundles of electric wires of the two groups and the respective stranding directions are opposite to each other (bilateral symmetric), it is possible to configure the cable with the operation unit having less curl tendency and excellent mechanical characteristics.

Details of Embodiment of Present Invention

A specific example of a cable with an operation unit according to an embodiment of the present invention is described with reference to the drawings.

In the meantime, the present invention is not limited to the example, is defined in the claims and includes all changes within meanings and ranges equivalent to the claims.

FIG. 1 is a plan view illustrating a configuration of a cable 1 with an operation unit according to an embodiment.

As shown in FIG. 1, the cable 1 with the operation unit includes a cable 2 and an operation unit 3 provided on a middle of the cable 2.

The cable 2 includes separated parts 2A, in which the cable 2 is divided into two cables along a longitudinal direction (a front and rear direction in FIG. 1) of the cable 2, and integrated parts 2B in which the cable 2 is integrally configured. The separated parts 2A are respectively provided on both sides (front and rear sides in FIG. 1) of the operation unit 3 by a predetermined length such that the operation unit 3 is positioned therebetween in the longitudinal direction of the cable 2. In this example, lengths of the two separated parts 2A are substantially the same. However, the separated parts may be formed to have appropriate lengths, respectively, depending on an aspect of the cable 2 to be used.

The operation unit 3 is arranged between the two separated parts 2A and is electrically and mechanically connected to end portions of the separated parts 2A of the cable 2. The operation unit 3 includes an operation button for transmitting a signal to be transmitted and received through the cable 2, and the like, for example. The operation unit 3 includes a housing made of synthetic resin or the like, and an electric circuit (including components such as semiconductor elements and the like) provided in the housing, for example.

A boundary part between the separated part 2A and the integrated part 2B is provided with a reinforcing member 4 made of resin body (grommet, tube or the like) such as polyvinyl chloride, for example. The reinforcing member 4 covers at least a portion of the separated part 2A and a portion of the integrated part 2B. In the meantime, as the reinforcing member 4, a configuration where the boundary part is wrapped and reinforced by a resin tape, for example, may also be adopted.

Figure 2:
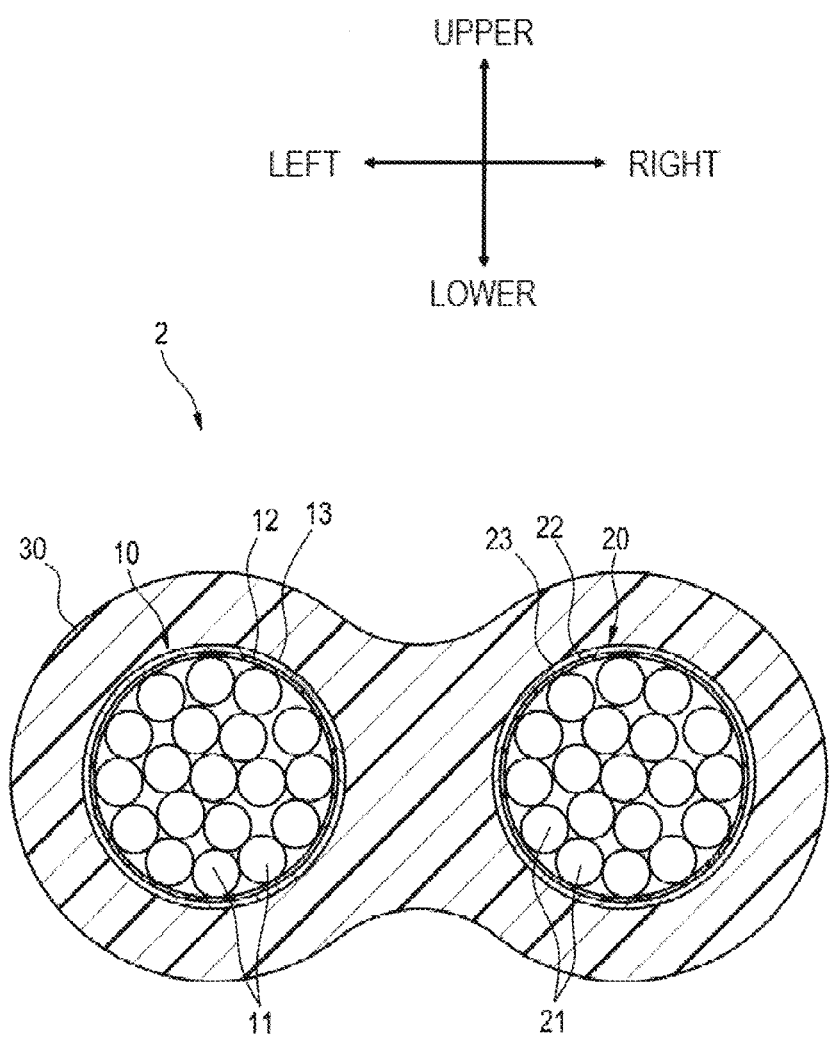
FIG. 2 is a sectional view of the cable with the operation unit shown in FIG. 1 taken along a line A-A.

FIG. 2 is a sectional view taken along a line A-A of FIG. 1. As shown in FIG. 2, the cable 2 includes a plurality of bundles of electric wires (in this example, a first bundle 10 of electric wires and a second bundle 20 of electric wires) in the integrated part 2B.

The first bundle 10 of electric wires is formed as a bundle of electric wires of one group in which a plurality of core electric wires 11 are bundled to be circular, as seen from a sectional view of FIG. 2. The core electric wires 11 are signal wires, insulated electric wires, coaxial wires, paired stranded wires, and the like, for example. The core electric wires 11 may be used as electric wires for USB (Universal Serial Bus) plug connection, electric wires for AUX (Auxiliary) plug connection, electric wires for HDMI (High-Definition Multimedia Interface) (registered trademark) plug connection, and the like. The first bundle 10 of electric wires may include the core electric wires 11 of different wire types and utilities.

A wrapping tape 12 is provided around the first bundle 10 of electric wires. The wrapping tape 12 is formed by spirally wrapping a tape around the first bundle 10 of electric wires, for example. As the tape configuring the wrapping tape 12, a resin (PET) tape is preferably used, for example. In the meantime, instead of the resin tape, a metal/resin tape (a tape having a metal foil and a resin tape bonded to each other) may be wrapped around the first bundle 10 of electric wires so as to provide a function as a shield layer 13, which will be described later.

A shield layer 13 is provided around the wrapping tape 12. The shield layer 13 is formed by spirally wrapping a thin metal wire around the wrapping tape 12, for example. In the meantime, the shield layer 13 may also be formed by wrapping a metal/resin tape or by braiding a thin metal wire as a wire.

The second bundle 20 of electric wires has a configuration similar to the first bundle 10 of electric wires and is formed as a bundle of electric wires of one group in which a plurality of core electric wires 21 are bundled to be circular. The core electric wires 21 are electric wires of which type and utility are similar to the core electric wires 11. An outer diameter of the second bundle 20 of electric wires is substantially the same as an outer diameter of the first bundle 10 of electric wires. A wrapping tape 22 is formed around the second bundle 20 of electric wires, and a shield layer 23 is formed around the wrapping tape 22, like the first bundle 10 of electric wires.

The first bundle 10 of electric wires covered with the wrapping tape 12 and the shield layer 13, and the second bundle 20 of electric wires covered with the wrapping tape 22 and the shield layer 23 are arranged in parallel with a predetermined interval and are covered with a sheath 30. The sheath 30 is formed of a resin material such as polyvinyl chloride (PVC), polyurethane, silicone and the like. In this example, the cable 2 is formed as a so-called eyeglasses-shaped (a number '8' shape) cable in which the first bundle 10 of electric wires and the second bundle 20 of electric wires are integrally covered with the sheath 30.

The separated part 2A (refer to FIG. 1) of the cable 2 is a part in which a substantially center part of the sheath 30 in a right and left direction is split and the first bundle 10 of electric wires and the second bundle 20 of electric wires covered with the sheath 30 are thus individually separated one group by one group. In contrast, in the integrated part 2B of the cable 2, the first bundle 10 of electric wires and the second bundle 20 of electric wires are not separated and are kept with being integrally covered by the sheath 30.

Meanwhile, in this example, the cable 2 having the two bundles of electric wires is separated into two cables each of which has the bundle of electric wires, respectively. However, the present invention is not limited thereto. For example, a cable having three bundles of electric wires may be separated into three cables each of which has the bundle of electric wires, respectively, or a cable having four bundles of electric wires may be separated into four cables each of which has the bundle of electric wires, respectively. Also, the wire types, the numbers, the arrangements and the like of the core electric wires to be included in each of the first bundle 10 of electric wires and the second bundle 20 of electric wires are not limited to the shown example. Also, the first bundle 10 of electric wires and the second bundle 20 of electric wires have a substantially true circular section, respectively, but may have an elliptical section, an angular section or the like.

According to the cable 1 with the operation unit configured as described above, the separated parts 2A are provided at front and rear parts of the operation unit 3 by a predetermined length, in which each of the first bundle 10 of electric wires and the second bundle 20 of electric wires is separately (individually) configured. Therefore, when the operation unit 3 is moved and the bending or twisting force is applied to the cable 2, 2A, the first bundle 10 of electric wires and the second bundle 20 of electric wires separately (individually) configured as one group are freely moved, so that it is possible to relieve the force applied to the cable. Accordingly, the bending or twisting force is difficult to be applied to the plurality of core electric wires 11, 21 configuring the first bundle 10 of electric wires and the second bundle 20 of electric wires, so that the core electric wires 11, 21 are difficult to break.

Also, since the boundary parts between the separated parts 2A and the integrated parts 2B are reinforced by the reinforcing members 4, even though the cable 2 is bent or twisted, it is possible to prevent the integrated parts 2B from being split from the boundary parts.

Also, since the first bundle 10 of electric wires and the second bundle 20 of electric wires are integrally covered with the sheath 30, it is possible to easily arrange the cable.

Subsequently, modified embodiments of the cable, which is to be used for the cable 1 with the operation unit, are described with reference to FIGS. 3 and 4. In the meantime, since the parts denoted with the same reference numerals as the above embodiment have the similar functions, the overlapping descriptions thereof are omitted.

Modified Embodiment 1

Figure 3:
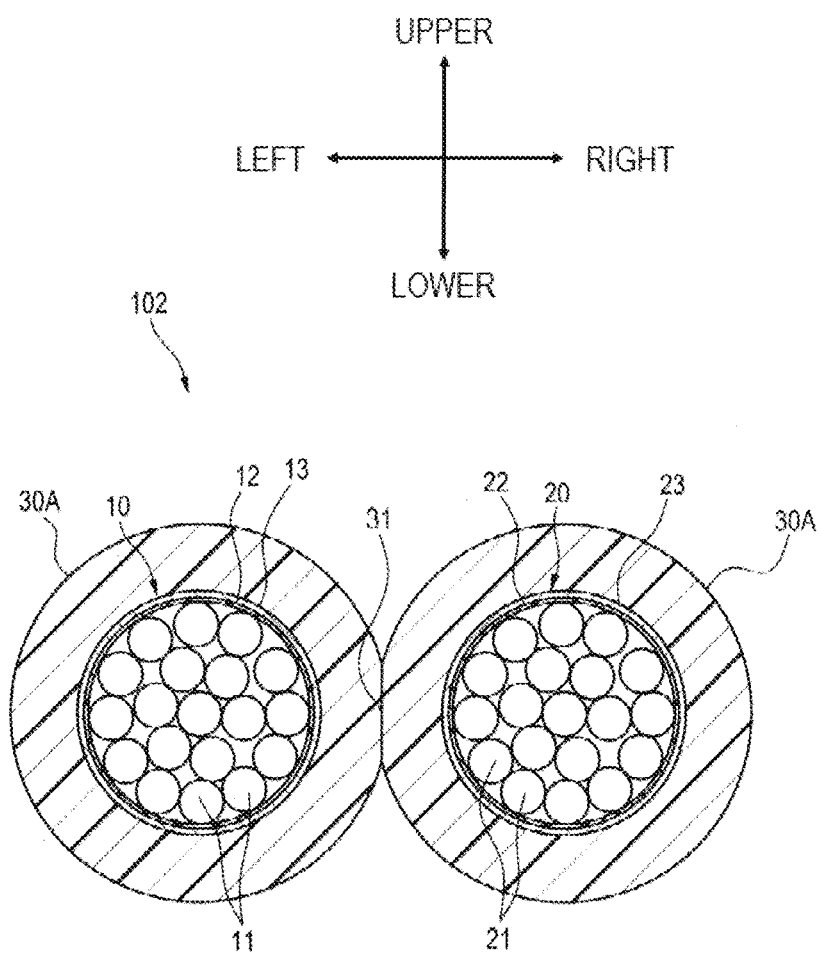
FIG. 3 is a sectional view of a cable with an operation unit according to a modified embodiment 1 taken along the line A-A of FIG. 1.

FIG. 3 is a sectional view of the cable 1 with the operation unit using a cable 102 according to a modified embodiment 1 taken along the line A-A of FIG. 1. As shown in FIG. 3, an integrated part of the cable 102 of the modified embodiment 1 is integrally configured by fusing the first bundle 10 of electric wires and the second bundle 20 of electric wires each of which is covered with a sheath 30A.

For example, the first bundle 10 of electric wires covered with the wrapping tape 12, the shield layer 13 and the sheath 30A and the second bundle 20 of electric wires covered with the wrapping tape 22, the shield layer 23 and the sheath 30A are arranged in parallel in the right and left direction, and parts 31 of the respective sheaths 30A are fused in a longitudinal direction of the cable 102.

According to the cable 1 with the operation unit configured as described above, it is possible to easily manufacture the cable 102 by individually preparing the first bundle 10 of electric wires and the second bundle 20 of electric wires in advance each of which is covered with the sheath 30A and fusing the sheaths 30A each other.

Modified Embodiment 2

Figure 4:
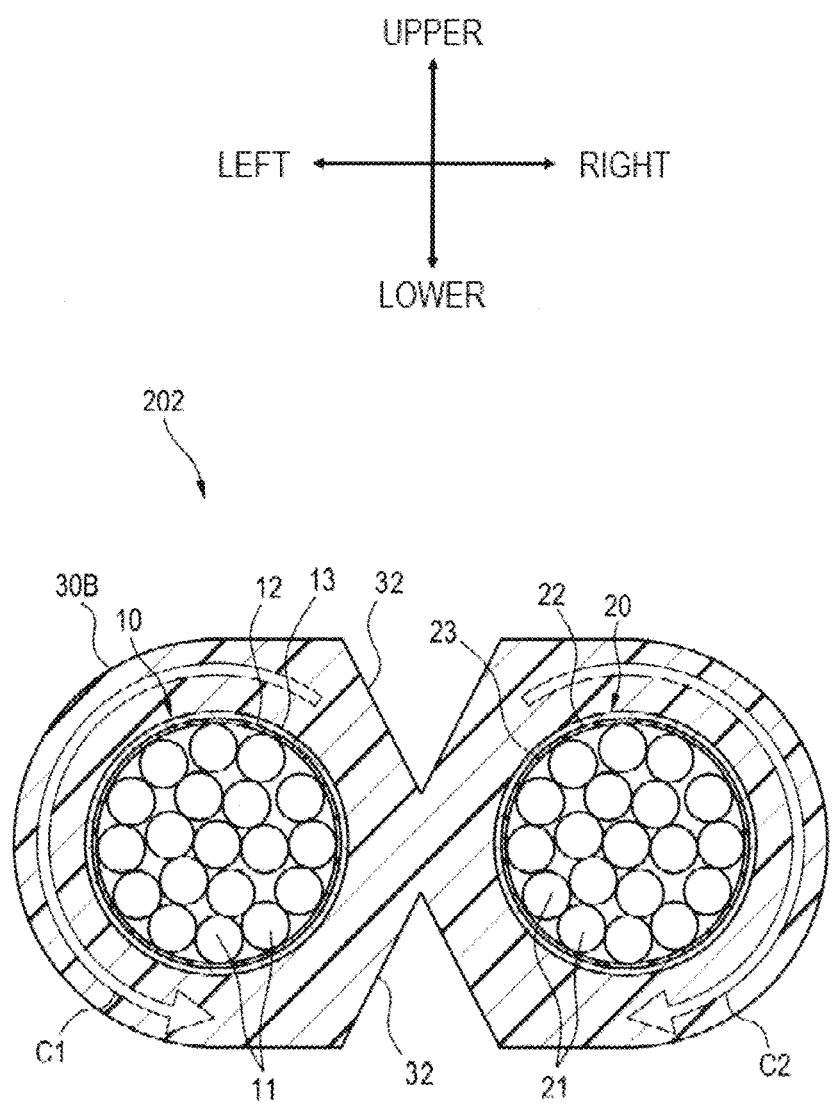
FIG. 4 is a sectional view of a cable with an operation unit according to a modified embodiment 2 taken along the line A-A of FIG. 1.

FIG. 4 is a sectional view of the cable 1 with the operation unit using a cable 202 according to a modified embodiment 2 taken along a line A-A of FIG. 1. As shown in FIG. 4, in an integrated part of the cable 202 of the modified embodiment 2, the plurality of core electric wires 11 configuring the first bundle 10 of electric wires are stranded, and the plurality of core electric wires 21 configuring the second bundle 20 of electric wires are stranded in an opposite direction to a stranding direction of the core electric wires 11.

For example, as shown in FIG. 4, the plurality of core electric wires 11 configuring the first bundle 10 of electric wires are stranded in a counterclockwise direction C1. In contrast, the plurality of core electric wires 21 configuring the second bundle 20 of electric wires are stranded in a clockwise direction C2 opposite to the stranding direction C1 of the core electric wires 11.

A part of the sheath 30B between the first bundle 10 of electric wires and the second bundle 20 of electric wires may be formed with a pair of notches (cutouts) 32 facing each other along the longitudinal direction of the cable 1 with the operation unit, for example. In the modified embodiment 2, the notches 32 are provided in upper and lower surfaces of the cable 1 with the operation unit.

According to the cable 1 with the operation unit including the cable 202 configured as described above, since the core electric wires 11 of the first bundle 10 of electric wires and the core electric wires 21 of the second bundle 20 of electric wires are respectively stranded and the respective stranding directions are opposite to each other, the cable has less curl tendency and the mechanical characteristics thereof can be improved.

Also, since the notches 32 are provided, the bendability and twistability of the cable 1 with the operation unit are favorably kept. Also, when splitting the cable 202 into the first bundle 10 of electric wires and the second bundle 20 of electric wires, it is possible to easily separate the cable through the notches 32.

In the meantime, the configuration where the core electric wires 11 of the first bundle 10 of electric wires and the core electric wires 21 of the second bundle 20 of electric wires are respectively stranded and the respective stranding directions are opposite to each other can be also adopted for the eyeglasses-shaped cable 2 shown in FIG. 2 and the fusing-type cable 102 shown in FIG. 3.

Example

An example of the cable with the operation unit described in the above embodiment is described.

As Example 1 (Inventive Example), a cable with an operation unit having the configuration shown in FIG. 1 was manufactured. For the cable, the eyeglasses-shaped cable 2 shown in FIG. 2 was used. The first bundle of electric wires and the second bundle of electric wires each of which was formed by bundling a plurality of (several tens of) core electric wires were wrapped by a polyester tape, which is the wrapping tape, and a thin metal wire was laterally wrapped around the tape to form a shield layer. As the core electric wires, insulated electric wires or coaxial wires of AW30 to 40 were used. The outer diameters of the first bundle of electric wires and the second bundle of electric wires were 1.8 mm. The first bundle of electric wires and the second bundle of electric wires were arranged in parallel and were coated to form a sheath by extrusion. A thickness (a vertical length) of the cable was 2.5 mm, a width (a length in the right and left direction) was 4.7 mm, a length of the separated part 2A was 50 mm, and a length of the reinforcing member 4 in the front and rear direction was 10 mm.

As Example 2 (Comparative Example), a cable having a configuration (the cable 2 was entirely configured by the integrated part 2B and the integrated part 2B was directly connected to the operation unit 3) where the separated parts 2A of the cable with the operation unit shown in FIG. 1 were not provided was manufactured. The reinforcing member 4 was not provided.

The bending test was performed for the cables with the operation unit of Examples 1 and 2. In the bending test, the cable with the operation unit having a length of 50 cm was vertically hung and the operation unit was gripped with a clamp. A weight of 5N was hung to a lower end of the cable. The cable was bent by moving the clamp at speed of 30 times per minute between ±60° with respect to the vertical direction about a point, which was a center of rotation, 10 cm downward vertically from the clamp. After the clamp was moved from a start position to which the cable was vertically moved down to a position at which +60° was formed from the vertical direction, the clamp was moved to a position at which −60° was formed from the vertical direction in an opposite direction and was then moved in an opposite direction and returned to the start position, so that one cycle bending was performed. When the number of times until any one of the core electric wires of the cable with the operation unit was broken was 15,000 times or more, the cable passed the test, and when the number of times was less than 15,000, the cable failed the test.

The configuration of Inventive Example (Example 1) having the separated parts 2A shown in FIG. 1 passed the test, and the configuration of Comparative Example (Example 2) with no separated parts 2A failed the test.

Similarly, the test was performed for a cable in which the cable 102 of the modified embodiment 1 shown in FIG. 3 was used and for a cable in which the cable 202 of the modified embodiment 2 shown in FIG. 4 was used. As a result, it was possible to confirm that the modified embodiment 1 and the modified embodiment 2 passed the bending test when the separated parts 2A shown in FIG. 1 were provided and failed the bending test when the separated parts were not provided.

Although the present invention was described in detail with reference to the specific embodiments, it is apparent to one skilled in the art that a variety of changes and modifications can be made without departing from the spirit and scope of the present invention. Also, the numbers, positions, shapes and the like of the above-described constitutional members are not limited to the embodiment, and can be changed to the numbers, positions, shapes and the like, which are favorable for implementation of the present invention.

DESCRIPTION OF REFERENCE NUMERALS

1: Cable with an operation unit
2, 102, 202: Cable
2A: Separated part
2B: Integrated part
3: Operation unit
4: Reinforcing member
10: First bundle of electric wires
11, 21: Core electric wire
12, 22: Wrapping tape
13, 23: Shield layer
20: Second bundle of electric wires
30, 30A, 30B: Sheath
31: Part of sheath 30A
32: Notch (cutout)

The invention claimed is:

1. A cable with an operation unit provided on a middle of the cable which comprises a plurality of core electric wires, wherein the plurality of core electric wires are bundled to form a bundle of electric wires, wherein the bundle of electric wires is divided into two groups, each of which is covered with a coating resin, and wherein the cable comprises:
   a separated part provided at each of front and rear parts of the operation unit by a predetermined length, in which bundles of electric wires of the two groups are separately configured, the bundles of electric wires of the two groups being integrated at a connection to the operation unit before the separated part; and
   an integrated part in which the bundles of electric wires of the two groups are integrated at a part except the separated part.

2. The cable with an operation unit according to claim 1, wherein a boundary part between the separated part and the integrated part is covered with a reinforcing resin.

3. The cable with an operation unit according to claim 1, wherein in the integrated part, the bundles of electric wires of the two groups are integrally covered with the coating resin.

4. The cable with an operation unit according to claim 1, wherein in the integrated part, the bundles of electric wires of the two groups are respectively covered with the coating resins, and the coating resins are fused each other at a portion where the coating resins are contacted to each other.

5. The cable with an operation unit according to claim 1, wherein in the integrated part, the plurality of core electric wires are stranded in each of the bundles of electric wires of the two groups, and respective stranding directions are opposite to each other.

* * * * *